United States Patent
Behzad et al.

(10) Patent No.: US 7,433,662 B2
(45) Date of Patent: *Oct. 7, 2008

(54) MIXER GAIN CONTROL WITH GAIN TRACKING OFFSETS

(75) Inventors: Arya Behzad, Poway, CA (US); C. Paul Lee, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 570 days.

This patent is subject to a terminal disclaimer.

(21) Appl. No.: 11/167,407

(22) Filed: Jun. 27, 2005

(65) Prior Publication Data

US 2006/0057991 A1 Mar. 16, 2006

Related U.S. Application Data

(60) Provisional application No. 60/609,192, filed on Sep. 10, 2004.

(51) Int. Cl.
H04B 7/00 (2006.01)
H04B 1/06 (2006.01)

(52) U.S. Cl. .................. 455/239.1; 455/250.1; 330/278

(58) Field of Classification Search ............... 455/232.1, 455/233.1, 234.1, 235.1, 236.1, 239.1, 240.1, 455/241.1, 250.1, 251.1, 234.2; 330/278, 330/129, 234
See application file for complete search history.

(56) References Cited

U.S. PATENT DOCUMENTS

| 5,642,078 | A | * | 6/1997 | Navabi et al. ............... 330/253 |
| 5,798,660 | A | * | 8/1998 | Cheng ........................ 327/65 |
| 6,040,731 | A | * | 3/2000 | Chen et al. .................. 327/359 |
| 6,046,640 | A | * | 4/2000 | Brunner ...................... 330/254 |
| 6,594,504 | B1 | * | 7/2003 | Grasset ..................... 455/550.1 |
| 7,257,382 | B2 | * | 8/2007 | Arai et al. ..................... 455/91 |
| 2006/0094395 | A1 | * | 5/2006 | Lee et al. ..................... 455/333 |

OTHER PUBLICATIONS

"5-GHz CMOS Radio Transceiver Front-End Chipset"; Ting-Ping Liu et al.; IEEE Journal of Solid-State Circuits, vol. 35, No. 12; Dec. 2000; pp. 1927-1933.

* cited by examiner

*Primary Examiner*—Edward Urban
*Assistant Examiner*—Christian A Hannon
(74) *Attorney, Agent, or Firm*—Garlick Harrison & Markison (57) ABSTRACT

An apparatus and method to use a gain control network across source terminals of cascode transistors that drive a differential current to control gain. The drains of the cascode transistors are coupled to a load such as a mixer. The cascode arrangement provides high impedance coupling to the load and the proximity of the gain control network allows offsets to be gain tracked to signal gain.

9 Claims, 7 Drawing Sheets

MIXER GAIN CONTROL WITH GAIN TRACKING OFFSETS

CROSS REFERENCE TO RELATED APPLICATION

This application claims the benefit of priority to U.S. Provisional Patent Application Ser. No. 60/609,192; filed Sep. 10, 2004; and titled "Mixer Gain Control Scheme With Gain Dependent Offsets," which is incorporated herein by reference.

BACKGROUND OF THE INVENTION

1. Technical Field of the Invention

The embodiments of the invention relate to communication devices and more particularly to a gain control scheme for a differential amplifier.

2. Description of Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage and an RF stage. The data modulation stage (baseband process) converts between data and baseband signals in accordance with the particular wireless communication standard. The RF stage (transmitter section and receiver section) converts between baseband signals and RF signals. The RF stage may be a direct conversion transceiver that converts directly between baseband and RF or may include one or more intermediate frequency stages.

Wireless communication devices utilize gain control circuitry to provide control over amplification. One type of gain control circuitry incorporates differential amplifiers. For example, a Gilbert cell mixer may employ such differential amplification stage or stages where gain may be adjusted. Although there are variety of techniques to adjust gain, many amplifiers adjust the gain of the amplifier without adjusting the gain of the offset voltages. For example, with a Gilbert cell mixer, a transconductance stage is typically employed to convert a voltage input into current to drive the mixer stage. The transconductance stage generally generates some amount of offset, since not all of the transistors in the transconductance stage are matched. This offset may be represented as a small direct current ($\Delta DC$) and when coupled to the mixer the $\Delta DC$ current causes a local oscillator (LO) feedthrough at the mixer output.

The offset may not be a significant concern, if the amplification factor is substantially high enough so that the signal-to-offset ratio is high. However, in other instances, the offset may affect the mixer drive current, which may result in appreciable LO feedthrough. LO feedthrough is a problem if it exceeds a leakage amount specified by a communication standard or if the feedthrough is sufficient to cause the receiver to not receive the signal properly.

Accordingly, it would be advantageous to implement a gain control scheme that scales the offset along with the signal, so that the offset is also gain adjusted, along with the signal.

SUMMARY OF THE INVENTION

The present invention is directed to apparatus and methods of operation that are further described in the following Brief Description of the Drawings, the Detailed Description of the Embodiments of the Invention, and the Claims. Other features and advantages related to the embodiments of the present invention will become apparent from the following detailed description of the embodiments of the invention made with reference to the accompanying drawings.

In one embodiment of the invention, a driver circuit has at least a pair of transistors disposed in a cascode arrangement and the gate terminals of the cascode transistors coupled together to receive a bias voltage. Their source terminals are coupled to receive a differential drive current from a previous stage, and their drains coupled to differentially drive a load. In one application of the embodiment, the previous stage is a transconductance stage that converts voltage to current and the load is a mixer.

A gain control network is coupled across the source terminals of the pair of cascode transistors to control gain of the drive current. The gain control network is situated at the source of the cascode transistors to scale gain of an offset current coupled from the previous stage with gain of a signal coupled by the drive current.

In one embodiment, a shunt network is placed across the source terminals of the cascode transistors to adjust gain of the drive signal current to the mixer, as well as providing gain tracking to the offset coupled from the previous transconductance stage.

DETAILED DESCRIPTION OF THE EMBODIMENTS OF THE INVENTION

The embodiments of the present invention may be practiced in a variety of settings that implement a differential amplifier that employs gain control.

Figure 1:
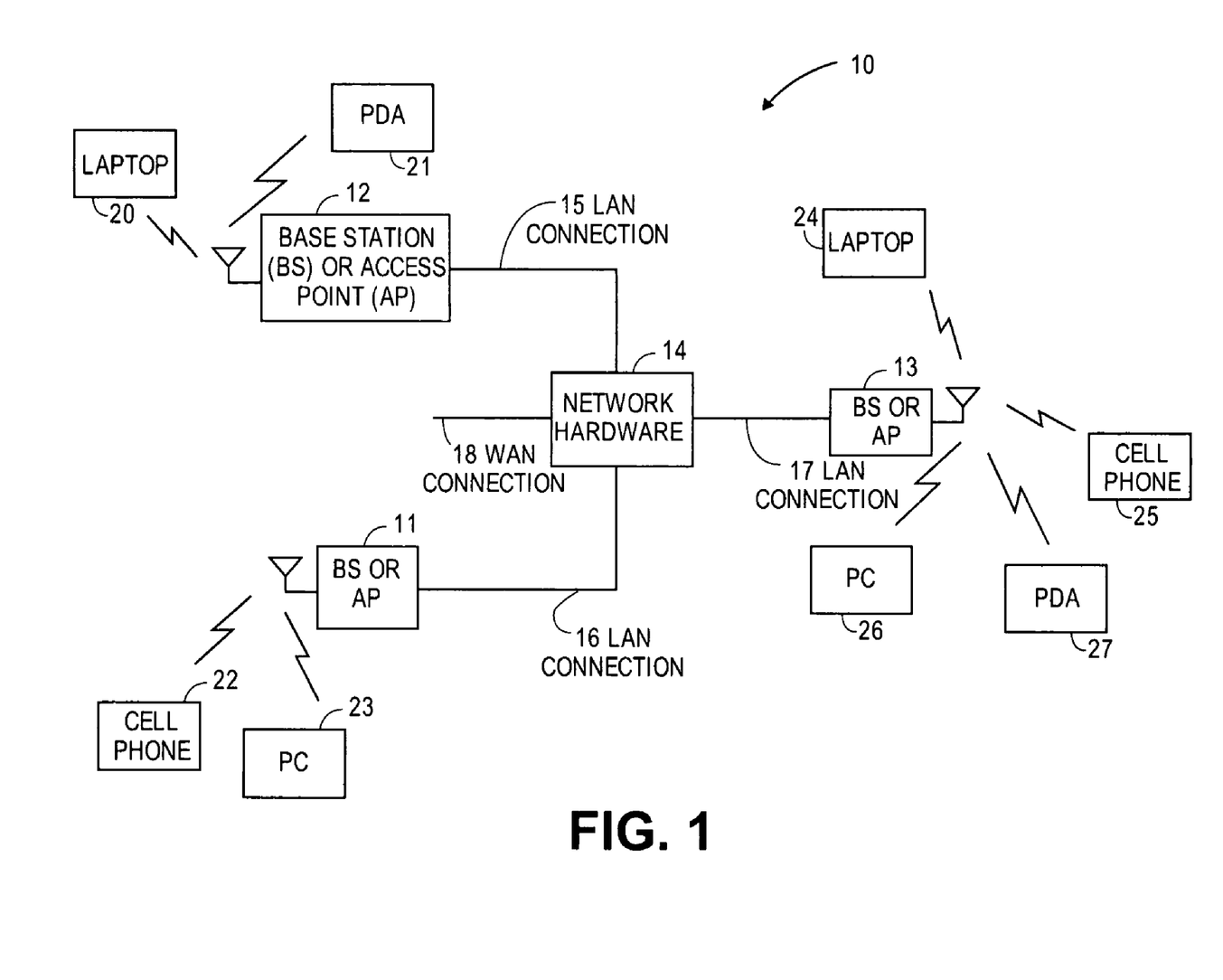
FIG. 1 is a block schematic diagram illustrating a wireless communication system in accordance with one embodiment of the present invention.

FIG. 1 is a schematic block diagram illustrating a communication system 10 that includes a plurality of base stations (BS) and/or access points (AP) 11-13, a plurality of wireless communication devices 20-27 and a network hardware component 14. Wireless communication devices 20-27 may be laptop host computers 20 and 24, personal digital assistant hosts 21 and 27, personal computer hosts 23 and 26, cellular telephone hosts 22 and 25, and/or any other type of device that supports wireless communications. The details of the wireless communication devices will be described with reference to FIG. 2.

Base stations or access points 11-13 may be operably coupled to network hardware 14 via respective local area network (LAN) connections 15-17. Network hardware 14, which may be a router, switch, bridge, modem, system controller, et cetera, may provide a wide area network (WAN) connection 18 for communication system 10. Individual base station or access point 11-13 generally has an associated antenna or antenna array to communicate with the wireless communication devices in its area. Typically, the wireless communication devices register with a particular base station or access point 11-13 to receive services within communication system 10. For direct connections (i.e., point-to-point communications), wireless communication devices may communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers to enhance performance, reduce costs, reduce size, and/or enhance broadband applications.

Figure 2:
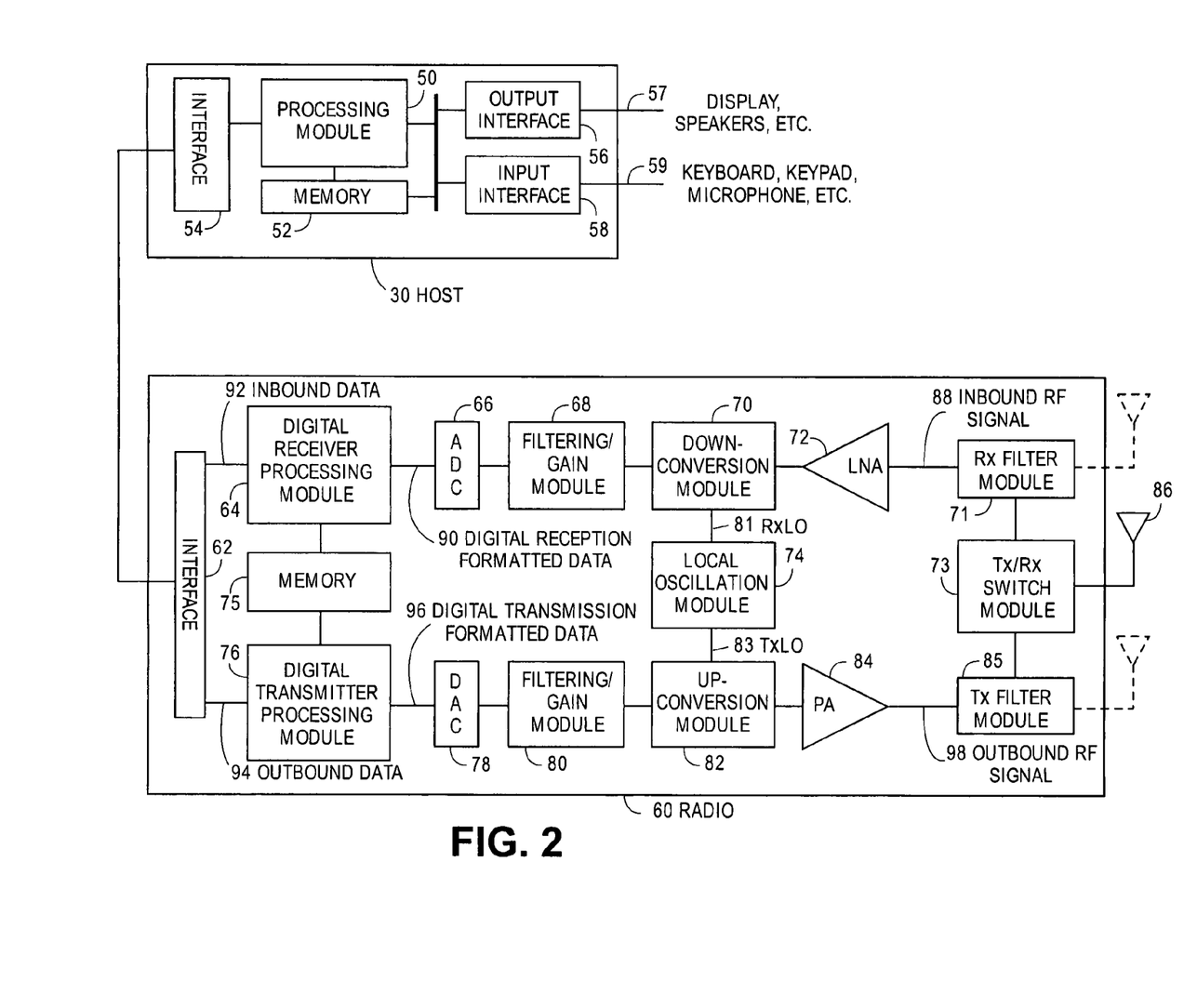
FIG. 2 is a schematic block diagram illustrating a wireless communication device in accordance with one embodiment of the present invention.

FIG. 2 is a schematic block diagram illustrating a wireless communication device that includes a host unit 30 and an associated radio unit 60. Host unit 30 may be incorporated in a communication device, such as one or more of the wireless communication devices 20-27 shown in FIG. 1. For cellular telephone hosts, radio 60 is typically a built-in component. For personal digital assistants hosts, laptop hosts, and/or personal computer hosts, radio 60 may be built-in or may be an externally coupled component that couples to host device 30 via a communication link, such as a PCI interface, PCMCIA interface, USB interface, or another type of interface.

As illustrated, host device 30 includes a processing module 50, memory 52, radio interface 54, input interface 58, and output interface 56. Processing module 50 and memory 52 execute corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For inbound data received from radio 60, radio interface 54 provides the data to processing module 50 for further processing and/or routing to output interface 56. Output interface 56 provides connectivity to an output display device 57, such as a display, monitor, speakers, et cetera, such that the received data may be displayed or otherwise output. Radio interface 54 also provides outbound data from processing module 50 to radio 60. Processing module 50 may receive the outbound data from an input device 59, such as a keyboard, keypad, microphone, et cetera, via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter (ADC) 66, a filtering/gain/attenuation module 68, an intermediate frequency (IF) mixing down conversion stage noted as down-conversion module 70, a receiver filter module 71, a low noise amplifier (LNA) 72, a transmitter/receiver (Tx/Rx) switch module 73, a local oscillation module 74, a memory 75, a digital transmitter processing module 76, a digital-to-analog converter (DAC) 78, a filtering/gain/attenuation module 80, an IF mixing up conversion stage noted as up-conversion module 82, a power amplifier (PA) 84, a transmitter filter module 85, and an antenna 86. The antenna 86 may be a single antenna that is shared by the transmit and receive paths as controlled by Tx/Rx switch 73, or may include separate antennae for the transmit path and receive path (shown by the dotted line). The antenna implementation may depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. Digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when processing module 64 and/or 76 implements one or more of its functions via a state machine, analog circuitry, digital circuitry, and/or logic circuitry, the memory storing the corresponding operational instructions may be embedded with the circuitry comprising the state machine, analog circuitry, digital circuitry, and/or logic circuitry. Memory 75 stores, and the processing module 64 and/or 76 executes, operational instructions that facilitate functionality of the device. In some embodiments, the combination of digital receiver processing module 64, digital transmitter processing module 76 and memory 75 may be referred to together as a "baseband processor."

In operation, radio 60 receives outbound data 94 from host 30 via host interface 62. Host interface 62 routes outbound data 94 to digital transmitter processing module 76, which processes outbound data 94 in accordance with a particular wireless communication standard (e.g., IEEE802.11a, IEEE802.11b, IEEE802.11g, Bluetooth, et cetera) to produce digital transmission formatted data 96. Digital transmission formatted data 96 is typically a digital base-band signal or a digital low IF signal, where the low IF typically may be in the frequency range of one hundred kilohertz to a few megahertz (MHz).

Digital-to-analog converter 78 converts digital transmission formatted data 96 from the digital domain to the analog domain. Filtering/gain/attenuation module 80 filters and/or adjusts the gain of the analog signal prior to providing it to up-conversion module 82 for mixing. Up-conversion module 82 directly converts the analog baseband or low IF signal into an RF signal based on a transmitter local oscillation (Tx LO) 83 provided by local oscillation module 74.

Power amplifier 84 amplifies the RF signal to produce outbound RF signal 98, which is filtered by transmitter filter module 85. Antenna 86 propagates outbound RF signal 98 to a targeted device such as a base station, an access point and/or another wireless communication device.

Radio 60 also receives inbound RF signal 88 via antenna 86, which was transmitted by a base station, an access point, or another wireless communication device. Antenna 86 provides inbound RF signal 88 to receiver filter module 71 via Tx/Rx switch 73, where Rx filter 71 bandpass filters inbound RF signal 88. Rx filter 71 provides the filtered RF signal to low noise amplifier 72, which amplifies signal 88 to produce an amplified inbound RF signal. The low noise amplifier 72 provides the amplified inbound RF signal to down-conversion module 70, which directly converts the amplified inbound RF signal into an inbound low IF signal or baseband signal based on a receiver local oscillation (Rx LO) 81 provided by local oscillation module 74. Down-conversion module 70 provides the inbound low IF signal or baseband signal to filtering/gain/attenuation module 68. Filtering/gain/attenuation module 68 may be implemented to filter and/or attenuate the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to host device 30 via radio interface 54.

As one of ordinary skill in the art will appreciate, the particular wireless communication device of FIG. 2 may be implemented using one or more integrated circuits. For example, host 30 may be implemented on one integrated circuit and digital receiver processing module 64, digital transmitter processing module 76 and memory 75 may be implemented on a second integrated circuit, and the remaining components of radio 60, less the antenna 86, may be implemented on a third integrated circuit. As an alternative embodiment, radio 60 may be implemented on a single integrated circuit. As yet another alternative embodiment, processing module 50 of host 30 and digital receiver and transmitter processing modules 64 and 76 may be a common processing device implemented on a single integrated circuit. Further, memory 52 and memory 75 may be implemented on a single integrated circuit and/or on the same integrated circuit as the common processing modules of processing module 50 and digital receiver and transmitter processing module 64 and 76.

Figure 3:
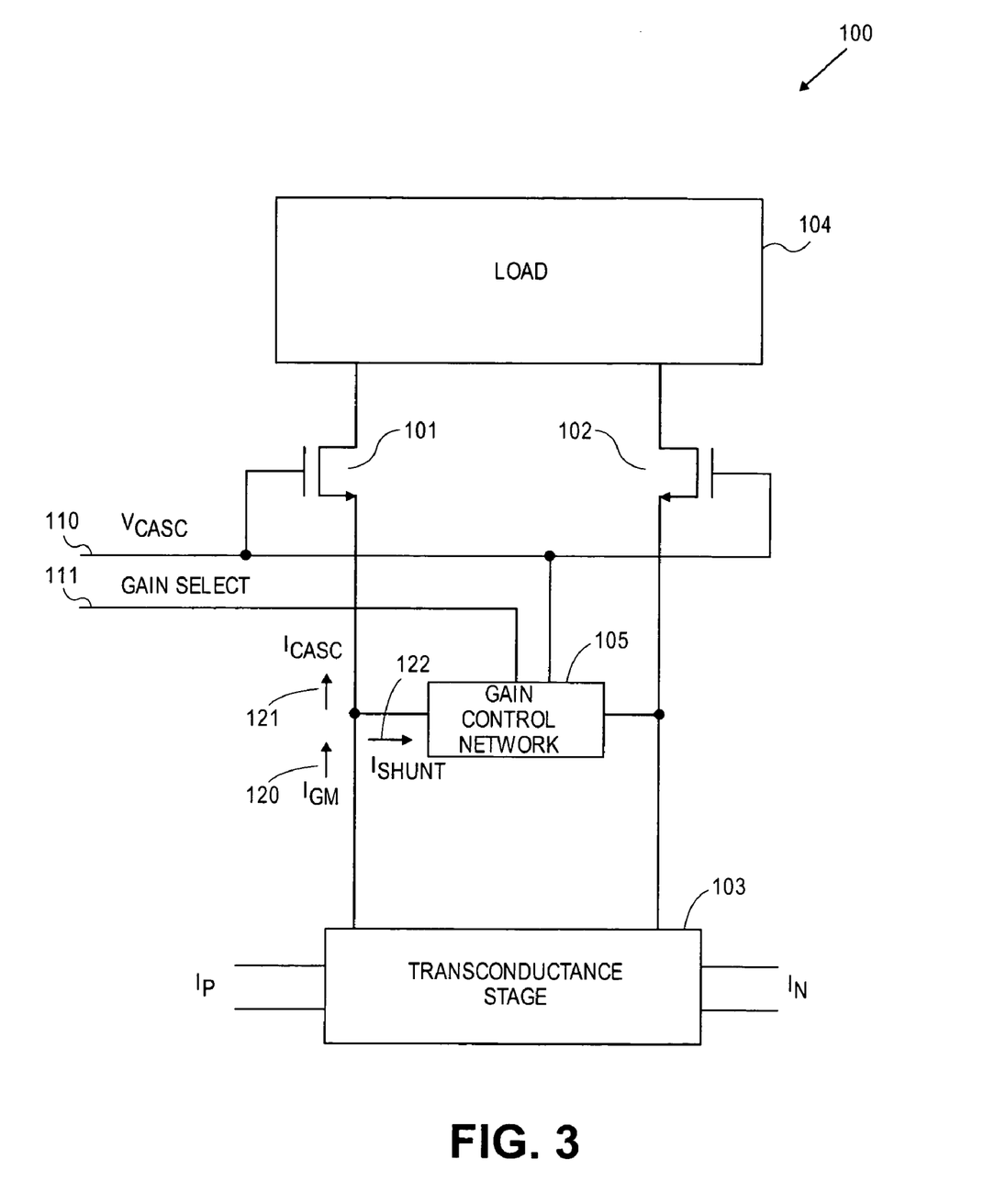
FIG. 3 is a block schematic diagram illustrating one embodiment of a gain control scheme disposed across source terminals of a differential amplifier stage.

FIG. 3 shows one embodiment of a circuit for practicing the present invention. FIG. 3 shows a driver circuit 100 that may be utilized to implement the gain control scheme of the present invention. Circuit 100 comprises a pair of cascode arranged transistors 101, 102, in which their source terminals are coupled to receive a differential drive current from a current source, such as a transconductance stage 103. A load 104 is coupled to the drain terminals of transistors 101, 102, which load 104 is driven by the drive current. A gain control network 105 is coupled across the source terminals of the cascode transistors 101, 102. A cascode bias voltage $V_{CASC}$ 110 is coupled to gates of transistors 101, 102. In the particular embodiment shown, $V_{CASC}$ is also coupled to gain control network 105, along with a GAIN SELECT signal 111. The cascode arrangement has high impedance at the drain so as to provide high impedance coupling of transconductance stage 103 to load 104. As noted in the description below, a common practice is to use a transconductance amplifier to drive a mixer load. However, embodiments of the invention may be readily adapted to employ one of a variety of current sources to drive a load and need not be limited to the use of a transconductance stage to drive a mixer. In one embodiment, the load is a Gilbert cell mixer.

Thus, cascode transistors 101, 102 are utilized to couple the drive current from transconductance stage 103 to load 104. As to how much of the drive current is actually coupled to load 104 is dependent on the action of gain control circuit 105. As noted, $I_{GM}$ denotes one leg of the differential drive current from transconductance stage 103. Depending on the setting of gain control network 105, a portion of $I_{GM}$ is shunted to gain control network 105 and is shown as shunt current $I_{SHUNT}$. The remaining current, cascode current $I_{CASC}$ 121, is coupled to transistor 101. Thus, gain control network 105 operates as a current divider, so that $$I_{GM} = I_{SHUNT} + I_{CASC}$$

Assuming that $I_{GM}$ stays substantially constant, adjusting the value of $I_{SHUNT}$ results in a proportional adjustment of $I_{CASC}$ in the opposite direction. Since $I_{CASC}$ is the drive current to the cascode transistors 101, 102, which differentially drive load 104, the value of $I_{CASC}$ may be used to set the amplification factor (gain) available. Gain control network 105 is used to directly set the value of $I_{SHUNT}$ and, therefore, indirectly set the value for $I_{CASC}$. Although gain control network 105 may be fixed, so that gain of circuit 100 is also fixed, one embodiment of the invention allows gain control network 105 to be adjustable, by making $I_{SHUNT}$ adjustable. In one embodiment, a GAIN SELECT signal is used to select the value of $I_{SHUNT}$ and allow for the selection of a gain value for circuit 100. As will be noted below, in one embodiment, GAIN SELECT is made programmable so that gain may be programmably selected.

The bias voltage $V_{CASC}$ is also coupled to gain control network 105 in circuit 100. Although a different bias voltage may be coupled to gain control network 105, one embodiment of circuit 100 applies the same $V_{CASC}$ voltage on gates of shunt transistors of gain control network 105. Accordingly, when differential input signals $I_P$ and $I_N$ are coupled as differential inputs to transconductance stage 103, stage 103 converts the $I_P/I_N$ voltages to current to generate the drive current to load 104. The drive current from stage 103 is gain adjusted by gain control network 105. In the shown example, gain control network 105 adjusts the amount of $I_{SHUNT}$, so that network 105 functions as an attenuator to adjust the gain. It is to be noted that a variety of amplification control or attenuation control circuitry may be utilized to perform the gain control at the source terminals of the cascode transistors 101, 102.

When load 104 is a mixer, input signals $I_P$ and $I_N$ are used to provide one set of differential drive signals to the mixer. For example, if the mixer is in a transmit path, such as in up-conversion module 82 of FIG. 2, the mixer may combine a modulation signal with a local oscillator (LO) to generate a modulated radio frequency (RF) signal. Transconductance stage 103 provides one set of inputs to such a mixer.

In most applications, transconductance stage 103 generates an offset current. The offset is generated from various combination of factors, but one primary cause is due to mismatched $V_T$ of transistors in the transconductance circuit. The offset is a DC component that adds/subtracts from the drive current. As noted in the background section above, the offset may contribute to the LO feedthrough. By placing gain control network 105 between transconductance stage 103 and load 104, the offset current is subjected to the same gain adjustment as the drive current, since the offset current is shunted in the approximate same proportion as $I_{GM}$ to $I_{SHUNT}$. That is, the offset current is gain scaled to the drive current.

Since the adjustment is performed at the source of the cascode transistors 101, 102, no new offsets are introduced by additional transistors, other than transistors 101, 102. However, because of source degeneration presented by the cascode arrangement, the cascode transistors 101, 102 do not contribute appreciable offset. Furthermore, if transistors 101 and 102 are manufactured as matched transistors, then hardly any offset would be introduced by transistors 101, 102. It may be appreciated that matching the cascode transistors is much easier to implement, than to match all of the transistors in transconductance stage 103 to attempt to prevent the offset.

Figure 4:
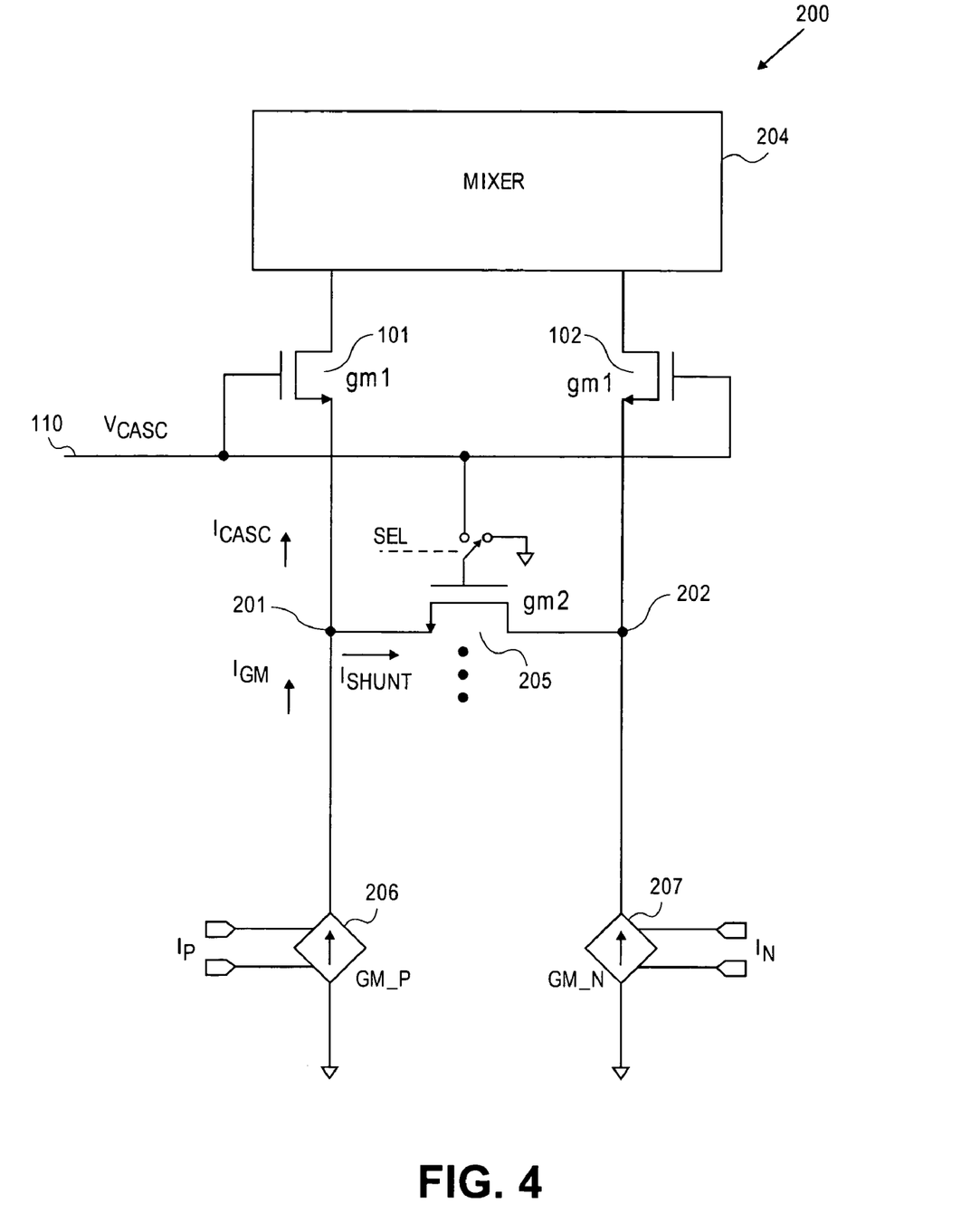
FIG. 4 is a circuit schematic diagram of one embodiment of a differential gain control circuit for the schematic diagram of FIG. 3, in which one or more shunt transistors are disposed across source terminals of cascode transistors to adjust gain of the current feeding a mixer.

FIG. 4 shows one embodiment for implementing the circuit 100 of FIG. 3. In FIG. 4, a circuit 200 employs cascode transistors 101, 102 as drivers with their gates coupled to $V_{CASC}$ 110. Load 104 of FIG. 3 is now shown as a mixer load 204. Although a variety of mixer circuits may be employed, in one embodiment, mixer load 204 is a Gilbert Cell mixer, in which current drive from transistors 101, 102 determines the gain of mixer 204. For the embodiment of FIG. 4, transconductance stage 103 is represented by a pair of transconductance current sources GM_P 206 and GM_N 207. In this particular embodiment, differential voltage input signals $I_P$ and $I_N$ generate the drive currents.

Gain control network 105 of FIG. 3 is now shown as one or more transistors 205 in circuit 200. Although only one transistor 205 is shown in FIG. 4, it is to be noted that there may be a plurality of transistors arranged across nodes 201 and 202. $I_{SHUNT}$ represents the amount of current flowing between nodes 201 and 202, whether there is only one active transistor or multiple active transistors across nodes 201, 202. In the particular embodiment of circuit 200, either $V_{CASC}$ is applied to the gate of transistor 205 to turn on (activate) transistor 205 or a low potential, such as ground, is placed on the gate to turn off (deactivate) transistor 205. Signal SEL is used to control which potential is to be switched on to the gate of transistor 205. The SEL signal corresponds to the GAIN SELECT signal of FIG. 3 when multiple transistors 205 are present. Although a ground is shown coupled to the gate of transistor 205, a low voltage sufficient to turn off transistor 205 may be applied.

Figure 5:
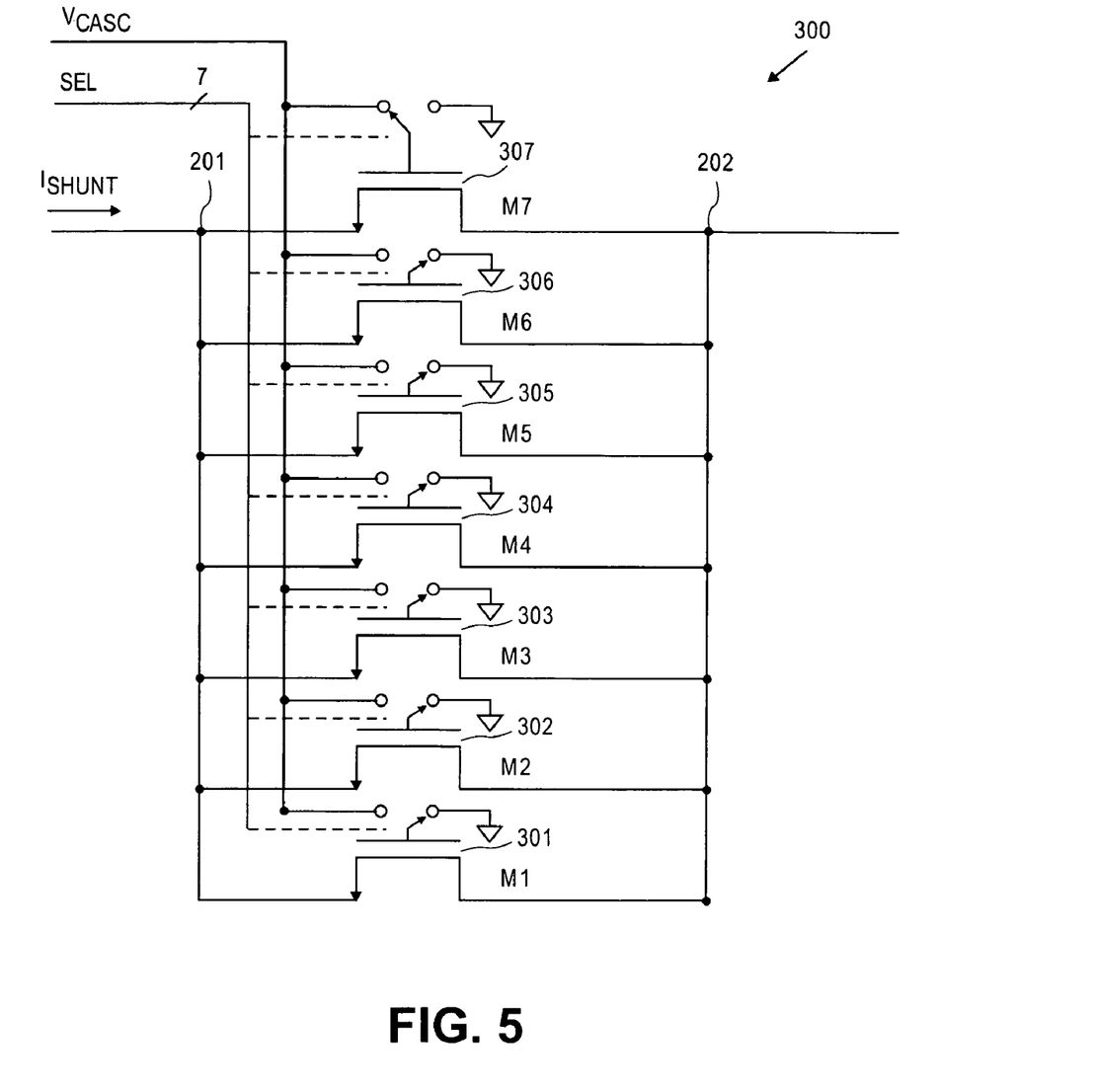
FIG. 5 is a circuit schematic diagram of an embodiment of a shunt transistor network used with the circuit of FIG. 4 to provide multiple gain factors that may be programmably controlled.

Also referring to FIG. 5, transistor network 300 shows one embodiment for implementing multiple transistors across nodes 201, 202. In the particular example, seven transistors 301-307 (also noted as M1-M7) are shown arranged in parallel across nodes 201, 202. Transistors M1-M7 comprise gain control network 105 of FIG. 3. The gates of M1-M7 are individually controlled by separate SEL signals so that each transistor activation may be controlled separately. In the particular example illustrated for network 300, M7 is shown in the activated position with $V_{BIAS}$ applied to the gate of M7, while the remaining transistors M1-M6 are shown in the deactivated state with the gates coupled to ground. The particular example of FIG. 5 shows the gates coupled to ground, but other embodiments may couple the gates to a low voltage that turns off the transistors M1-M7.

Since the amount of current flow between nodes 201, 202 is determined by the number of transistors in the turn-on state, $I_{SHUNT}$ is minimum when all transistors M1-M7 are off and $I_{SHUNT}$ is maximum when all transistors M1-M7 are on. Furthermore, since $I_{SHUNT}$ is inversely proportional to $I_{CASC}$ due to the current division of $I_{GM}$, maximum gain (minimum attenuation) is obtained from circuit 200 when M1-M7 are off and minimum gain (maximum attenuation) is obtained from circuit 200 when M1-M7 are all on. Intermediate gain ranges may be obtained by selectively activating/deactivating various combinations of M1-M7. Thus, by selectively turning on various transistors M1-M7, gain attenuation may be achieved in steps by increasing $I_{SHUNT}$ accordingly.

It is to be noted that the gain adjustment on the drive current is also applicable to the offset current, so that the offset current is scaled to the drive current. Thus, when the drive current is attenuated to such a level that a small drive current is fed to the mixer, the offset is attenuated proportionately, to prevent a significant LO feedthrough in the mixer.

In FIG. 5, the SEL signal may be made programmable, so that various gain settings may be programmed. The SEL signal controls which one or combination of transistors M1-M7 are to be on. The activation/deactivation of M1-M7 is shown by manipulation of switches at the gates of M1-M7 for simplicity. However, various mechanisms may be used to apply voltages to the gates of M1-M7. Furthermore, the switching may be achieved remotely and not necessarily at the gate location of M1-M7, as shown.

Although various activation schemes may be implemented, one embodiment uses a sequential activation technique. In this technique, initial gain setting is set with only M7 turned on. The next lower gain setting is achieved by activating a second transistor, such as M6, so that both M6 and M7 are on. The subsequent lower gain settings are achieved by turning on an additional transistor at each step, until a lowest gain setting is achieved when M1-M7 are all on. As noted, this is one technique and many other sequences may be employed to establish the various gain settings.

Furthermore, the gain settings may be controlled by sizing the transistors. In some embodiments, all the shunt transistors may have the same characteristics, but in other embodiments, different characteristics may be attributed to the transistors. For example, some or all of the shunt transistors may be of different sizing. Thus, various design options are available to set the current values through the shunt transistors.

It is to be noted that with circuit 200, $V_{CASC}$ is also coupled to the gates of M1-M7 to activate M1-M7. One advantage of applying $V_{CASC}$ to transistors 101, 102 and the shunt transistors M1-M7 is that the gate-to-source voltage (Vgs) of these transistors are the same. Thus, any variations that are noted by these transistors affect the transistors in an equivalent manner, so that the transistors track each other. Accordingly, circuit variations that cause a change in $I_{SHUNT}$ also affect $I_{CASC}$ in an equivalent manner, so that the overall change is negligible.

For example, if transistors 101 and 102 have a transconductance value noted as gm1 and transistor 205 has a transconductance value of gm2, the relationship of $I_{CASC}$ to $I_{GM}$ may be expressed by:

$$I_{CASC} = I_{GM} \times \frac{\frac{1}{2} \times \frac{1}{gm2}}{\frac{1}{2} \times \frac{1}{gm2} + \frac{1}{gm1}}$$

The transconductance value gm1 may be expressed by:

$$\frac{1}{gm1} = \frac{1}{\mu_n C_{OX} \frac{W}{L} (V_{CASC} - V_{th})}$$

where $\mu_n$ is carrier mobility, $C_{ox}$ is the oxide capacitance of the transistor, W and L are the width and length dimensions of the transistor and Vth is the threshold voltage of the transistor 101, 102.

The transconductance value of gm2 may be expressed by:

$$\frac{1}{gm2} = \frac{1}{\mu_n C_{OX} \frac{W}{L} (V_{CASC} - V_{th} - V_{DS})}, V_{DS} \cong 0$$

in which $V_{DS}$ is deemed negligible for the shunt transistor (e.g. transistor 205).

The equations show that the current division at the node 201, as well as 202, is dependent strictly on the transconductance values gm1 and gm2, at least for the first order equations, and not on the transistor parameters which are affected by process, voltage and temperature. It is to be noted that in one embodiment, the shunt transistor or transistors operate in a triode region. That is, the shunt transistor 205 operates as a resistor such that the current relationship with respect to its drain-to-source voltage is linear. Accordingly, in some instances it is possible for the shunt transistors to operate with other than $V_{CASC}$ applied to the gates of the shunt transistors.

Figure 6:
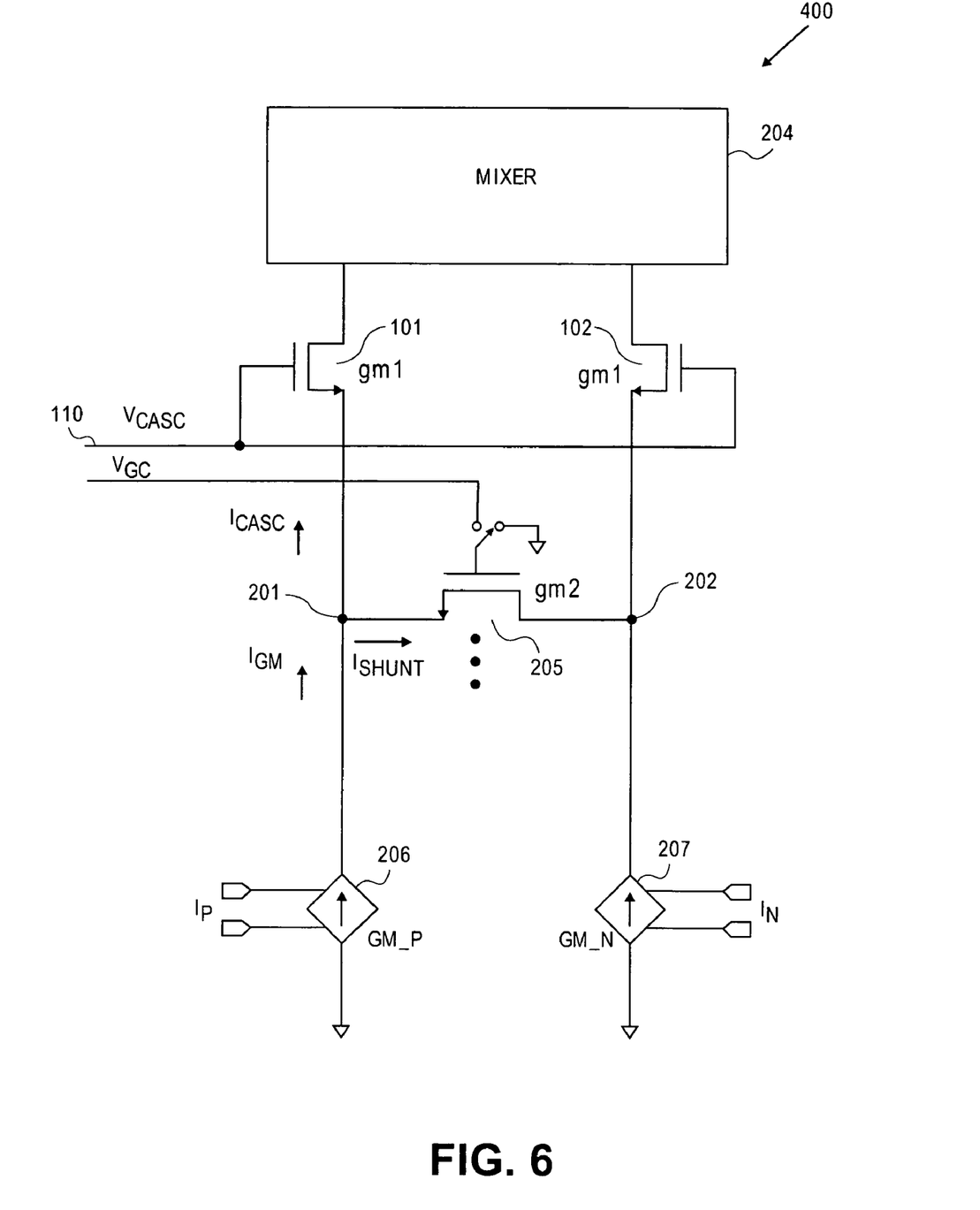
FIG. 6 is a circuit schematic diagram of another embodiment of a differential gain control circuit for the schematic diagram of FIG. 3, in which one or more shunt transistors are disposed across source terminals of cascode transistors, bit in which a bias voltage applied to gates of the shunt transistors is different than the bias voltage applied to gates of the cascode transistors.

FIG. 6 shows a circuit 400 which utilizes a gate bias voltage $V_{GC}$ on the gate of the shunt transistor or transistors, instead of $V_{CASC}$. Again, although one shunt transistor is shown, multiple shunt transistors may be present. Circuit 400 is equivalent to circuit 200 of FIG. 4, except that a different bias voltage is coupled to the gate(s) of the shunt transistor(s). In the particular embodiment, supply voltage $V_{GC}$ is applied to the shunt transistor(s), instead of $V_{CASC}$.

Figure 7:
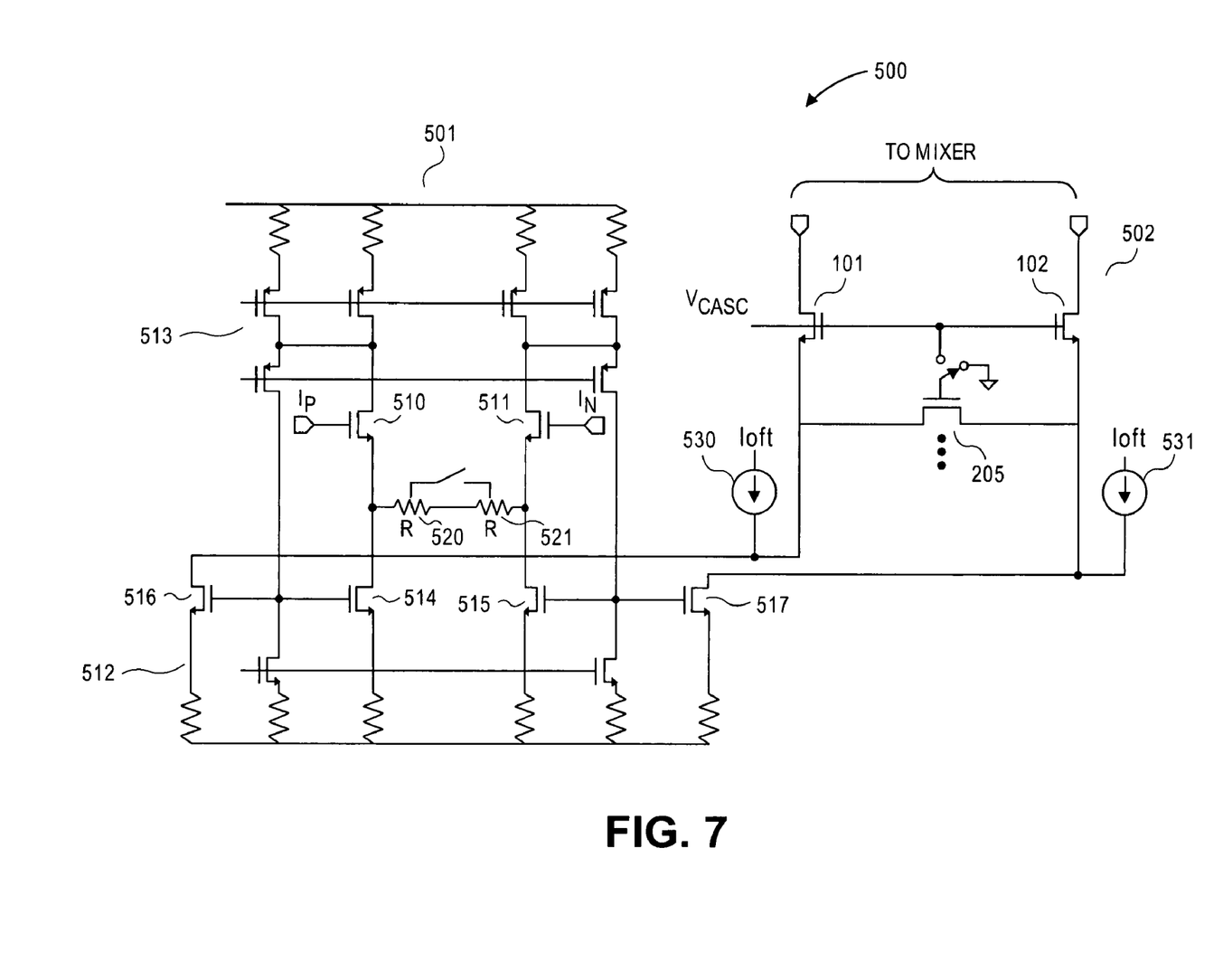
FIG. 7 is a circuit schematic diagram illustrating one example of a more detailed embodiment for the circuit of FIG. 3.

Referring to FIG. 7, a more detailed schematic diagram of a circuit 500 is shown as one example embodiment that may be implemented for circuit 100 of FIG. 3. Circuit 500 includes a transconductance stage 501 and a cascode configured driver and gain stage 502. Transconductance stage 501 is equivalent to stage 103 of FIG. 3. The cascode/gain stage 502 includes cascode transistors 101, 102 described above and one or more shunt transistors (represented by transistor 205) to control the gain of the current to the mixer.

The transconductance stage 501 includes input transconductance transistors 510, 511 to receive the input signals $I_P$ and $I_N$ and convert the input voltage to current. The sources of transistors 510, 511 are coupled to a current mirror driver network 512, which drives the differential output current to transistors 101, 102. The drains of transistors 510, 511 are coupled to a resistor/transistor network 513. Gain controlling resistors 520, 521 (shown as resistance R) are located across the sources of transistors 510, 511. The resistors may be variable to change the resistance to vary the gain.

Transistors 510, 511 and resistors 520, 521 are configured as source followers and network 513 provides a negative feedback path to the gates of transistors 514, 516 and to the gates of transistors 515, 517 to boost the effective transconductance of stage 501 by increasing the loop gain. Transistor pairs 514, 516 and transistor pairs 515, 517 operate as differential current mirrors to provide the drive signals to transistors 101, 102.

Even though gain control may be obtained for input signals $I_P$ and $I_N$ by adjusting R in stage 501, offsets that are generated by components of network 512 and/or network 513 are not scaled by adjusting R. That is, gain control provided at stage 501 does not scale the offset generated within the stage. Accordingly, in circuit 500 the drive current from current mirror driver network 512 is coupled to the cascode/gain stage 502, so that offsets are gain scaled with the signal current in stage 502.

In some embodiments, as an additional control mechanism, offset compensation currents may be introduced into the source legs of the cascode transistors 101, 102. The offset compensation is shown as local oscillator feedthrough (LOFT) compensation current by current sources 530, 531. Generally, any DC offset components noted into the mixer are compensated by introducing LOFT compensation to cancel the offset. It is appreciated that various other compensation techniques may be employed.

Thus, a gain control scheme is described in which an offset component is gain tracked to the drive signal before being introduced into the load. In some cases the gain scaling may be proportional between the offset component and the signal, but in others the proportionality may not be the same across the gain. In one embodiment, the gain scaling is employed to an output drive current from a transconductance stage, in which a gain control network is employed at the sources of a cascode transistor pair just before the load. The cascode arrangement provides high impedance coupling and by placing the gain control just before the load, none or very little offset is introduced after the gain adjustment.

The embodiments of the invention may be employed in various circuits, including circuitry that drives a mixer. For example, embodiments of the invention may be employed in a mixer that is placed in a transmission path of a radio, such as up-conversion module 82 of FIG. 2 and implemented in a wireless device, such as one or more devices shown in system 10 of FIG. 1.

We claim:

1. An apparatus comprising:
a driver having at least a pair of transistors disposed in a cascode arrangement and having their gate terminals coupled together to receive a bias voltage, their source terminals coupled to receive a differential drive current from a previous stage, and their drains coupled to differentially drive a load; and
a plurality of shunt transistors coupled across the source terminals of the pair of cascode transistors to attenuate the drive current by diverting a portion of the drive current away from the pair of cascode transistors, in which the attenuation scales gain of an offset current coupled from the previous stage with gain of a signal coupled by the drive current, the plurality of shunt transistors to have the bias voltage switched to a gate terminal of each respective shunt transistor to activate one or more of the respective shunt transistors, wherein activation of a particular shunt transistor or transistors determines the portion of the drive current diverted to allow different gain settings to be selected for the driver.

2. The apparatus of claim 1 wherein the plurality of shunt transistors are programmable to select different gain settings for the driver.

3. An apparatus comprising:
a driver having at least a pair of transistors disposed in a cascode arrangement and having their gate terminals coupled together to receive a bias voltage, their source terminals coupled to receive a differential signal current from a transconductance stage, and their drains coupled to differentially drive a mixer; and
a plurality of shunt transistors coupled across the source terminals of the pair of cascode transistors to attenuate the signal current by diverting a portion of the signal current away from the pair of cascode transistors, in which the attenuation scales gain of an offset current coupled from the transconductance stage with gain of the signal current, the plurality of shunt transistors to have the bias voltage switched to a gate terminal of each respective shunt transistor to activate one or more of the respective shunt transistors, wherein activation of a particular shunt transistor or transistors determines the portion of the signal current diverted to allow different gain settings to be selected for the driver.

4. The apparatus of claim 3 wherein the plurality of shunt transistors are programmable to select different gain settings for the driver.

5. The apparatus of claim 4 wherein maximum gain for the driver is obtained by having one of the shunt transistors active and gain is selectively reduced in steps by activating additional transistors in sequence.

6. The apparatus of claim 3 wherein the plurality of shunt transistors operate in a linear mode of operation to divert the signal current.

7. The apparatus of claim 3 wherein the mixer is a Gilbert cell mixer.

8. A method comprising:
receiving a differential signal current from a transconductance amplifier stage;
driving the differential signal current into source terminals of a pair of transistors disposed in a cascode arrangement and in which a mixer is coupled to drain terminals of the pair of transistors;
providing a bias voltage to gate terminals of the pair of transistors; and
selecting a gain for the pair of cascode transistors to drive the mixer by switching the bias voltage to respective gate terminals of one or more shunt transistors coupled across the source terminals of the pair of cascode transistors to activate one or more shunt transistors, in which activation of a particular shunt transistor or transistors determines a portion of the signal current that is diverted to allow different gain settings to be selected for driving the mixer and in which an offset current coupled from the transconductance amplifier stage is gain scaled with gain of the signal current.

9. The method of claim 8, wherein selecting the gain includes programmably switching the bias voltage for coupling to selected shunt transistors.

* * * * *